United States Patent
Fukakusa

(10) Patent No.: US 10,749,311 B2
(45) Date of Patent: Aug. 18, 2020

(54) LIGHT SOURCE DEVICE AND PROJECTION DEVICE

(71) Applicant: Panasonic Intellectual Property Management Co., Ltd., Osaka (JP)

(72) Inventor: Masaharu Fukakusa, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 170 days.

(21) Appl. No.: 15/934,057

(22) Filed: Mar. 23, 2018

(65) Prior Publication Data

US 2018/0212398 A1 Jul. 26, 2018

Related U.S. Application Data

(63) Continuation of application No. PCT/JP2016/004331, filed on Sep. 26, 2016.

(30) Foreign Application Priority Data

Sep. 29, 2015 (JP) ................................. 2015-192297

(51) Int. Cl.
*H01S 5/00* (2006.01)
*F21V 9/30* (2018.01)
(Continued)

(52) U.S. Cl.
CPC ............... *H01S 5/005* (2013.01); *F21K 9/64* (2016.08); *F21S 2/00* (2013.01); *F21V 5/04* (2013.01);
(Continued)

(58) Field of Classification Search
CPC . H01S 5/005; H01S 5/022; H01S 5/00; H01L 33/50; F21V 5/04; F21V 5/045;
(Continued)

(56) References Cited

U.S. PATENT DOCUMENTS

| 6,084,842 A * | 7/2000 | Miura | G11B 7/1362 369/112.19 |
| 2009/0040910 A1 * | 2/2009 | Fukakusa | G11B 7/1275 369/112.29 |

(Continued)

FOREIGN PATENT DOCUMENTS

| CN | 101170291 A | 4/2008 | |
| DE | 102010034054 A1 * | 2/2012 | F21V 9/20 |

(Continued)

OTHER PUBLICATIONS

International Search Report issued in Application No. PCT/JP2016/004331 dated Nov. 22, 2016, with English translation.

(Continued)

*Primary Examiner* — Bryon T Gyllstrom
*Assistant Examiner* — Colin J Cattanach
(74) *Attorney, Agent, or Firm* — McDermott Will & Emery LLP

(57) ABSTRACT

A light source device includes: a semiconductor light emitting element (laser element); an optical element that has a plurality of lens regions which are a plurality of divided regions, and that changes an intensity distribution of a light beam emitted from the semiconductor light emitting element, by the plurality of lens regions; and a phosphor element that emits light having, as excitation light, the light which has had the intensity distribution changed by the optical element. The phosphor element is disposed so that a light emitting surface of the phosphor element is inclined with respect to a plane having an optical axis of the excitation light as a normal line, the plurality of lens regions have respective first focal points different from each other, and light beams incident on the plurality of lens regions and focused on the first focal points overlap on the light emitting surface of the phosphor element.

10 Claims, 13 Drawing Sheets

(51) Int. Cl.
| | |
|---|---|
| *H01S 5/022* | (2006.01) |
| *H01L 33/50* | (2010.01) |
| *F21V 5/04* | (2006.01) |
| *G02B 3/08* | (2006.01) |
| *F21S 2/00* | (2016.01) |
| *F21K 9/64* | (2016.01) |
| *G02B 26/08* | (2006.01) |
| *G03B 21/20* | (2006.01) |
| *H01L 33/58* | (2010.01) |
| *F21S 41/176* | (2018.01) |
| *F21V 13/08* | (2006.01) |
| *F21V 7/04* | (2006.01) |
| *F21V 13/14* | (2006.01) |
| *F21S 43/16* | (2018.01) |
| *F21V 13/12* | (2006.01) |
| *F21V 7/00* | (2006.01) |
| *F21V 7/09* | (2006.01) |
| *F21V 9/32* | (2018.01) |
| *F21V 9/35* | (2018.01) |
| *F21Y 115/30* | (2016.01) |

(52) U.S. Cl.
CPC ............... *F21V 9/30* (2018.02); *G02B 3/08* (2013.01); *G02B 26/0816* (2013.01); *G03B 21/2013* (2013.01); *G03B 21/2033* (2013.01); *H01L 33/50* (2013.01); *H01S 5/00* (2013.01); *H01S 5/022* (2013.01); *F21S 41/176* (2018.01); *F21S 43/16* (2018.01); *F21V 5/045* (2013.01); *F21V 7/0091* (2013.01); *F21V 7/048* (2013.01); *F21V 7/09* (2013.01); *F21V 9/32* (2018.02); *F21V 9/35* (2018.02); *F21V 13/08* (2013.01); *F21V 13/12* (2013.01); *F21V 13/14* (2013.01); *F21Y 2115/30* (2016.08); *H01L 33/58* (2013.01)

(58) Field of Classification Search
CPC ...... F21V 9/30; F21V 9/32; F21V 9/35; F21V 9/45; F21V 13/08; F21V 13/12; F21V 13/14; F21V 7/0091; F21V 7/048; F21V 7/09; G02B 3/08; G02B 26/0816; F21K 9/64; G03B 21/2013; G03B 21/2033; F21S 41/176; F21S 43/16
See application file for complete search history.

(56) References Cited

U.S. PATENT DOCUMENTS

| | | | |
|---|---|---|---|
| 2010/0034072 A1* | 2/2010 | Mizuyama | G02B 3/08 369/112.23 |
| 2010/0080105 A1* | 4/2010 | Fukakusa | G02B 5/189 369/112.23 |
| 2012/0106183 A1* | 5/2012 | Takahashi | F21S 41/675 362/509 |
| 2013/0182452 A1 | 7/2013 | Takahira et al. | |
| 2015/0016135 A1* | 1/2015 | Erdl | F21S 41/645 362/510 |
| 2016/0018066 A1* | 1/2016 | Abele | F21K 9/64 362/84 |
| 2016/0223891 A1* | 8/2016 | Miyata | F21V 14/08 |
| 2018/0045393 A1* | 2/2018 | Yagi | F21S 41/675 |
| 2018/0274738 A1* | 9/2018 | Khrushchev | F21S 41/14 |
| 2019/0250490 A1* | 8/2019 | Yokobayashi | G02B 27/141 |

FOREIGN PATENT DOCUMENTS

| | | | | |
|---|---|---|---|---|
| DE | 102012223610 A1 * | 6/2014 | | F21V 17/00 |
| JP | 2012-058638 A | 3/2012 | | |
| JP | 2013-149449 A | 8/2013 | | |
| JP | 2014-002839 A | 1/2014 | | |
| JP | 2014-010918 A | 1/2014 | | |
| JP | 2014-174442 A | 9/2014 | | |
| WO | WO-2017154371 A1 * | 9/2017 | | F21V 14/08 |

OTHER PUBLICATIONS

Office Action and Search Report issued in corresponding Chinese Application No. 201680054925.1, dated Jul. 30, 2019, with partial English translation

* cited by examiner

LIGHT SOURCE DEVICE AND PROJECTION DEVICE

CROSS REFERENCE TO RELATED APPLICATIONS

This application is a U.S. continuation application of PCT International Patent Application Number PCT/JP2016/004331 filed on Sep. 26, 2016, claiming the benefit of priority of Japanese Patent Application Number 2015-192297 filed on Sep. 29, 2015, the entire contents of which are hereby incorporated by reference.

BACKGROUND

1. Technical Field

The present disclosure relates to a light source device and a projection device, and particularly to a light source device that utilizes light which is emitted by irradiating a phosphor element with light emitted from a semiconductor light emitting element, and that is used in the field of display, such as a projection display device or the field of illumination, such as vehicle lighting and medical lighting, and to a projection device that uses the light source device.

2. Description of the Related Art

There has been conventionally known a light source device that utilizes light which is emitted by irradiating a phosphor element with light emitted from a semiconductor light emitting element. In such a light source device, in order to improve the light intensity distribution of light (excitation light) with which a phosphor element is irradiated, and to reduce the decrease in the conversion efficiency of the phosphor element due to the effect of heat generation by the excitation light, an attempt to uniformize the light intensity distribution of light with which the phosphor element is irradiated is being made (for instance, Japanese Unexamined Patent Application Publication No. 2013-149449, Japanese Unexamined Patent Application Publication No. 2014-2839)

FIG. 16 is a diagram illustrating the configuration of conventional light source device 100 disclosed in Japanese Unexamined Patent Application Publication No. 2013-149449.

In light source device 100 illustrated in FIG. 16, light emitted from laser element (laser chip) 111 of laser light source 110 enters a plane of incidence of optical rod 120, and propagates while being multiply reflected within optical rod 120. Thus, when the light emitted from laser light source 110 arrives at emission surface 121 of optical rod 120, the light intensity distribution is averaged, and the light has a uniform light intensity distribution.

The light emitted from optical rod 120 is emitted as divergent light, thus is focused by lens 130 and light emission unit 140 is irradiated with the light. In this manner, light source device 100 uniformizes the light intensity distribution of the light with which light emitting unit 140 is irradiated, using optical rod 120.

FIG. 17 is a diagram illustrating the configuration of conventional light source device 200 disclosed in Japanese Unexamined Patent Application Publication No. 2014-2839.

In light source device 200 illustrated in FIG. 17, the light emitted from laser light sources 210 is converted into parallel light by collimator lens 220, and is incident on hologram element 230. Hologram element 230 is formed so that the light intensity distribution of the excitation light on phosphor 240 is uniform. In this manner, light source device 200 uniformizes the light intensity distribution of the excitation light with which phosphor 240 is irradiated, by hologram element 230.

SUMMARY

The light source device disclosed in Japanese Unexamined Patent Application Publication No. 2013-149449 uses an optical rod to obtain a uniform light intensity distribution. However, the optical rod obtains uniform light intensity distribution with an increased number of multiple reflections, and thus the length of the optical rod needs to be increased to some extent. In addition, since the emission light from the optical rod becomes divergent light, the light needs to be focused once by a lens before the phosphor is irradiated with the light, thus the distance from the light emitting element to the phosphor is increased. Thus, a problem arises in that when a uniform light intensity distribution is attempted to be gained using an optical rod, the light source device cannot be miniaturized.

Also, the light source device disclosed in Japanese Unexamined Patent Application Publication No. 2014-2839 uses a hologram element to obtain a uniform light intensity distribution. However, since a hologram element uses diffraction phenomena of light, it is generally said that the hologram element has a lower efficiency than a lens. Also, the efficiency may be significantly reduced by an individual variability in the light emission wavelength of a laser element, change in the light emission wavelength due to a temperature, or the wavefront state (for instance, divergent light or converged light) of incident light to the hologram element, and there is a problem in that excitation light cannot be efficiently guided from a laser element to a phosphor. Also, a laser element can be a single mode laser element or a multi-mode laser element, and when a laser element is used as the light source for illumination, 1 W or higher light emission output is necessary, and it is typical to use a multi-mode laser element. However, in a multi-mode laser element, several emission wavefronts overlap in a multi-mode direction, and thus when a hologram element designed under the assumption of a certain incident wavefront is used, it is expected that a sufficient efficiency is not obtained. Like this, when a uniform light intensity distribution is attempted to be gained using a hologram device, there is a problem in that the light of a laser element cannot be converted into a uniform light intensity distribution efficiently.

The present disclosure has been made to solve the above-mentioned problems, it is an object of the disclosure to provide a light source device that is capable of efficiently converting the light emitted from a semiconductor light emitting element (laser element) into light having a uniform light intensity distribution, and that is compact.

In order to achieve the above-mentioned object, in an aspect of a light source device according to the present disclosure, a light source device includes: a laser element; an optical element that has a plurality of lens regions which are a plurality of divided regions, and that changes an intensity distribution of light emitted from the laser element, by the plurality of lens regions; and a phosphor element that emits light having, as excitation light, the light which has had the intensity distribution changed by the optical element. The phosphor element is disposed so that a light emitting surface of the phosphor element is inclined with respect to a plane having an optical axis of the excitation light as a normal line, the plurality of lens regions have respective first focal points different from each other, and light beams incident on the plurality of lens regions and focused on the first focal points overlap on the light emitting surface of the phosphor element.

With this configuration, light from a laser element incident on an optical element is propagated to the phosphor element as a plurality of light beams each of which is focused on the first focal point, by the plurality of lens regions. At this point, the plurality of light beams overlap with each other on the light emitting surface of the phosphor element, and thus a light intensity distribution is generated, in which the light of the laser element incident on each of the plurality of lens regions overlaps. In other words, the converted light is averaged and has a uniform light intensity distribution. Consequently, it is possible to achieve a light source device that is capable of efficiently converting the light emitted from the laser element to excitation light having a uniform light intensity distribution, and that is compact.

Also, in an aspect of the light source device according to the present disclosure, preferably, the respective first focal points of the plurality of lens regions are present forward or rearward of the light emitting surface of the phosphor element.

With this configuration, the plurality of lens regions can be easily designed so that light beams incident on the plurality of lens regions are focused on different first focal points, and overlap on the light emitting surface of the phosphor element.

Also, in an aspect of the light source device according to the present disclosure, preferably, the plurality of lens regions are divided in a direction of a first axis and in a direction of a second axis perpendicular to the first axis, and the first focal points are located on a plane which is formed by a third axis perpendicular to the first axis and the second axis, and the first axis, the plane including the optical axis of the excitation light.

With this configuration, the above-mentioned plurality of lens regions can be further easily designed, and focus to the different first focal points and overlapping on the phosphor element can be easily achieved.

Also, in an aspect of the light source device according to the present disclosure, preferably, the plurality of lens regions further have respective second focal points different from each other, the second focal points are located on a plane which is formed by the second axis and the third axis, the plane including the optical axis of the excitation light, and of the light beams emitted from the laser element and incident on the optical element, light beams that pass through at least the respective second focal points of the plurality of lens regions overlap on the light emitting surface of the phosphor element.

With this configuration, light from a laser element incident on an optical element is propagated to the phosphor element as a plurality of light beams each of which is also focused on the second focal point, by the plurality of lens regions. Also, at this point, the plurality of light beams overlap with each other on the light emitting surface of the phosphor element, and thus a light intensity distribution is generated, in which the light of the laser element incident on each of the plurality of lens regions overlaps. That is, not only on the plane formed by the third axis and the first axis, but also on the plane formed by the first axis and the second axis, the converted light is averaged and has a uniform light intensity distribution. Consequently, the light emitted from the laser element can be converted to excitation light having a further uniform light intensity distribution.

Also, in an aspect of the light source device according to the present disclosure, preferably, the respective second focal points of the plurality of lens regions are present forward or rearward of the light emitting surface of the phosphor element.

With this configuration, the plurality of lens regions can be easily designed so that light beams incident on the plurality of lens regions are also focused on different second focal points, and overlap on the light emitting surface of the phosphor element.

Also, in an aspect of the light source device according to the present disclosure, preferably, each of the plurality of lens regions has a width in the direction of the second axis smaller than a width in the direction of the first axis, and the phosphor element is inclined, with the direction of the first axis as a rotational axis.

With this configuration, even when the phosphor element is irradiated with an angle with excitation light, the vertical beam diameter and the horizontal beam diameter of the excitation light along the light emitting surface of the phosphor element (as viewed in a normal direction of the light emitting surface) can be easily equalized. Consequently, the light emitted from the laser element can be converted to excitation light having a further uniform light intensity distribution.

Also, in an aspect of the light source device according to the present disclosure, preferably, part or all of the plurality of lens regions is a rectangle or a hexagon.

With this configuration, the region not functioning as a lens can be minimized, and thus light can be converted into excitation light more efficiently.

Also, in an aspect of the light source device according to the present disclosure, preferably, a radiation angle of a light beam emitted from the laser element is different between the direction of the first axis and the direction of the second axis, and the light beam emitted from the laser element enters the plurality of lens regions so that one of the first axis and the second axis for a narrower radiation angle corresponds to the second axis.

With this configuration, the number of lens regions, which function for the intensity distribution (the incident light distribution) of incident light from the laser element, can be increased, and thus the incident light can be converted to excitation light having a further uniform light intensity distribution Also, in an aspect of the light source device according to the present disclosure, preferably, each of the plurality of lens regions is a Fresnel lens.

With this configuration, the thickness of the optical element can be thinned, and thus the distance from the laser element to the phosphor element can be further reduced. Therefore, further miniaturization of the light source device can be achieved.

Also, an aspect of a projection device according to the present disclosure includes an aspect of one of the light source devices described above.

With this configuration, a compact projection device can be achieved.

It is possible to achieve a light source device that is capable of efficiently converting the light emitted from a semiconductor light emitting element (laser element) into light having a uniform light intensity distribution, and that is compact.

BRIEF DESCRIPTION OF DRAWINGS

These and other objects, advantages and features of the disclosure will become apparent from the following description thereof taken in conjunction with the accompanying drawings that illustrate a specific embodiment of the present disclosure.

DETAILED DESCRIPTION OF THE EMBODIMENTS

Hereinafter an embodiment of the present disclosure will be described using the drawings. It is to be noted that each of the embodiments described below shows a preferable specific example of the present disclosure. Therefore, the numerical values, the components, the arrangement position and topology of the components, the processes (steps), and the order of the processes that are depicted in the following embodiments are examples, and not intended to limit the present disclosure. Thus, the components in the following embodiments, which are not described in the independent claim that defines the most generic concept of the present disclosure, are regarded as any components.

It is to be noted that in the present description and the drawings, coordinate axis which is first axis, coordinate axis 96 which is second axis, and coordinate axis 97 which is third axis indicate three axes of a three-dimensional orthogonal coordinate system. Similarly, coordinate axis 95' which is first axis, coordinate axis 96' which is second axis, and coordinate axis 97' which is third axis also indicate three axes of a three-dimensional orthogonal coordinate system.

Embodiment 1

Hereinafter, light source device 1 according to Embodiment 1 of the present disclosure will be described with reference to the drawings.

(Configuration)

Figure 1:
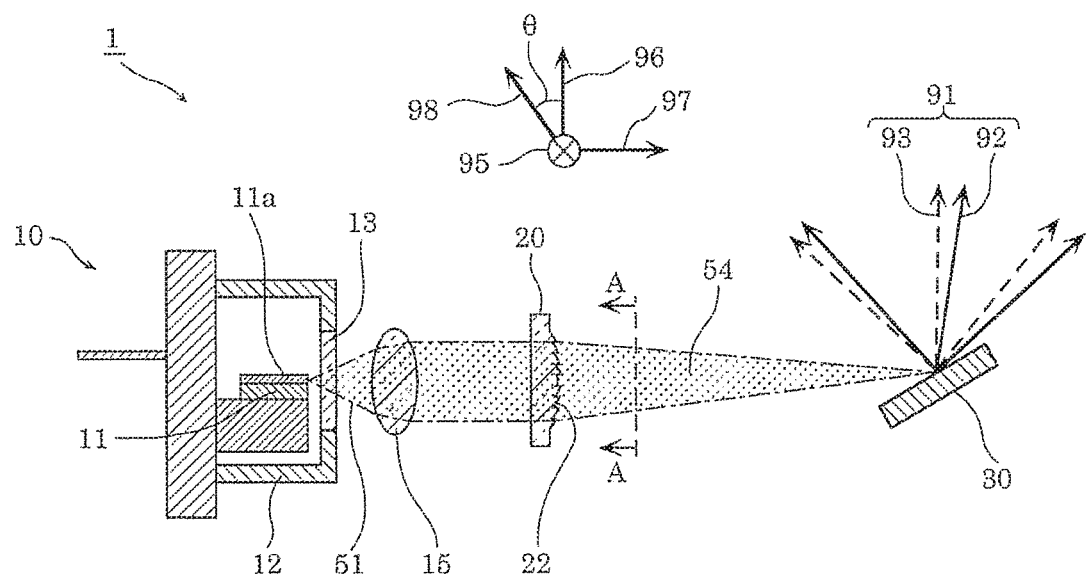
FIG. 1 is a diagram illustrating the configuration of a light source device according to Embodiment 1 of the present disclosure.

The configuration of light source device 1 according to Embodiment 1 of the present disclosure is illustrated in FIG. 1. As illustrated in FIG. 1, light source device 1 includes semiconductor light emitting device 10, optical element 20, and phosphor element 30.

Semiconductor light emission device 10 is a packaged light emitting device, and includes semiconductor light emitting element 11 having optical waveguide 11a, and cap (can) 12 made of metal constituting a package.

Semiconductor light emitting element 11 is disposed in cap 12. Specifically, semiconductor light emitting element 11 is mounted in a post disposed on a disc-shaped base. In this embodiment, semiconductor light emitting element 11 is disposed so that the direction of a stripe width of optical waveguide 11a matches the direction of coordinate axis 95. In other words, semiconductor light emitting element 11 is disposed so that the longitudinal direction (the stripe direction) of optical waveguide 11a matches the direction of coordinate axis 97.

Windowpane 13 is mounted on cap 12 so that emission light 51 from semiconductor light emitting element 11 can pass through cap 12. Windowpane 13 is an example of a translucent member that allows emission light 51 emitted from semiconductor light emitting element 11 to pass through, and is sheet glass in this embodiment. It is to be noted that semiconductor light emitting device 10 further includes a lead pin for supplying power to semiconductor light emitting element 11 from the outside.

Semiconductor light emitting element 11 is, for instance, a laser element composed of a nitride semiconductor (for instance, GaN-based laser element), and emits a laser beam having a peak wavelength between 380 nm and 490 nm of wavelength as emission light 51.

Also, lens 15 is disposed in proximity to windowpane 13 forwardly of semiconductor light emitting device 10. Lens 15 has a function of converting emission light 51 emitted from semiconductor light emitting device 10 (semiconductor light emitting element 11) into substantially parallel light. Lens 15 is, for instance, a collimator lens.

Optical element 20 is disposed between semiconductor light emitting device 10 and phosphor element 30. Specifically, optical element 20 is disposed between lens 15 and phosphor element 30. Therefore, substantially parallel light from lens 15 is incident on optical element 20.

Optical element 20 has optical functional unit 22 having a function of changing the intensity distribution of emission light 51 emitted from semiconductor light emitting element 11. The details of optical functional unit 22 will be described later.

Emission light 51 emitted from semiconductor light emitting element 11 passes through optical element 20, and thereby the light intensity distribution is changed, and the light has changed to convergence light and is incident on phosphor element 30 as excitation light 54.

Fluorescent material element 30 is disposed so that the light emitting surface of phosphor element 30 is inclined with respect to the surface having the optical axis (travelling direction) of excitation light 54 as the normal line. Specifically, phosphor element 30 is disposed so that the light emitting surface is inclined with respect to the central optical axis of optical element 20. Therefore, excitation light 54 enters phosphor element 30 with a predetermined incident angle. In this embodiment, phosphor element 30 is inclined around the direction of coordinate axis 95 (first axis) as a rotational axis direction. Specifically, when coordinate axis 95 is rotated as a rotational axis, phosphor element 30 is disposed so that normal direction 98 of phosphor element 30 is inclined with respect to coordinate axis 96 (second axis) by angle θ toward the opposite side from the traveling direction (the direction of coordinate axis 97) of excitation light 54. In other words, phosphor element 30 is disposed so that the light emitting surface of phosphor element 30 is inclined with respect to a plane having the optical axis of excitation light 54 as the normal line, around coordinate axis 95 as a rotational axis by angle (90°-θ). Angle θ is a rotational angle (inclination angle) of phosphor element 30.

Also, as excitation light 54, phosphor element 30 emits light having an intensity distribution changed by optical element 20. Fluorescent material element 30 has a phosphor as a wavelength conversion material which converts the wavelength of incident light. For instance, phosphor element 30 has a phosphor layer including phosphors. For instance, phosphors (phosphor particles) are mixed, dispersed in a transparent resin (binder) such as silicone, and are formed in layers which may be used as a phosphor layer. The phosphor fluorescently emits with incident light serving as excitation light. The phosphor is composed of, for instance, cerium-activated yttrium aluminum garnet (YAG: $Ce^{3+}$) based phosphor material. However, the phosphor is not limited to this.

Part of incident light (excitation light 54) to phosphor element 30 is absorbed in phosphor element 30, the wavelength is converted by the phosphor, and forms fluorescence 93 which radially diffuses, and the other part of incident light is reflected, diffused on the surface or the inside of phosphor element 30, and forms scattering light 92 which radially diffuses (scatters). Synthetic light composed of fluorescence 93 and scattering light 92 emits as radiant light 91 from phosphor element 30. In this case, a phosphor material (for instance, yellow phosphor material), which absorbs the light with a wavelength from 420 nm to 480 nm (for instance, blue light) and emits fluorescence with a wavelength from 500 nm to 630 nm, is used as the phosphor material of the phosphor, thereby making it possible to emit white light composed of fluorescence 93 and scattering light 92 as radiant light 91 from phosphor element 30.

Next, the configuration and the function of optical functional unit 22 of optical element 20 in Embodiment 1 of the present disclosure will be described in detail using FIG. 2, FIG. 3, and FIG. 4 with reference to FIG. 1.

First, the configuration of optical element 20 will be described using FIG. 2. FIG. 2 is a diagram illustrating the configuration of optical element 20 in light source device 1 according to Embodiment 1 of the present disclosure. (a) of FIG. 2 is a plan view of optical element 20, and illustrates optical element 20 as viewed from the emission side of excitation light 54. (b) of FIG. 2 is a cross sectional view from IIB-IIB in (a) of FIG. 2, and (c) of FIG. 2 is a cross sectional view from IIC-IIC in (a) of FIG. 2. It is to be noted that in (a) of FIG. 2 is the same as A-A in FIG. 1.

Figure 2:
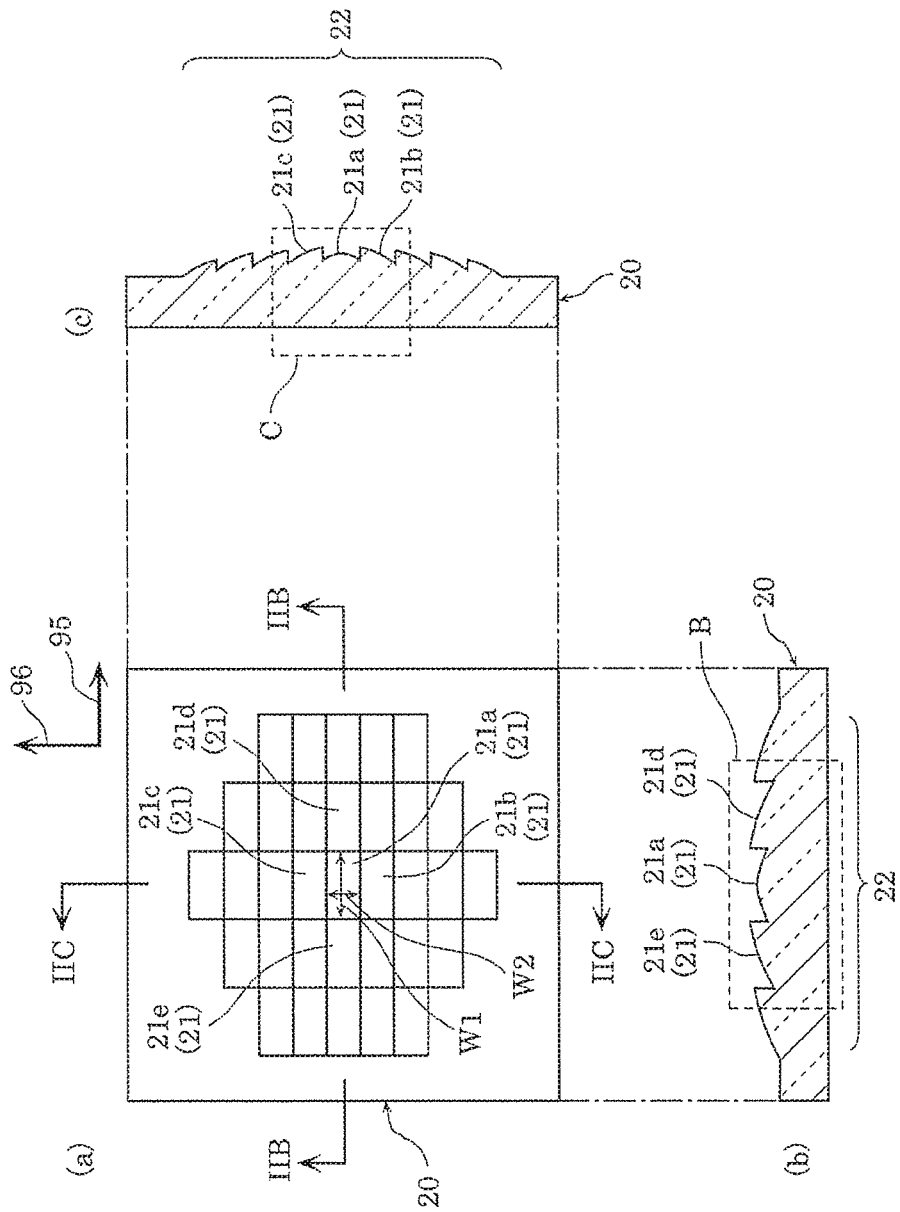
FIG. 2 is a diagram illustrating the configuration of an optical element in the light source device according to Embodiment 1 of the present disclosure.

As illustrated in (a) to (c) of FIG. 2, optical element 20 has a plurality of lens regions 21 (21a, 21b, 21c, 21d, 21e, . . . ) which are a plurality of divided region, as optical functional unit 22. Each of the plurality of lens regions 21 is an individual divided region (unit region) in optical functional unit 22. In this embodiment, a plurality of lens regions 21 are regions divided in the direction of coordinate axis 95 (first axis) and the direction of coordinate axis 96 (second axis). Optical element 20 changes the intensity distribution of emission light 51 emitted from semiconductor light emitting element U by the plurality of lens regions 21 (optical functional unit 22).

The plurality of lens regions 21 are each a lens that has a light focusing function. In other words, each of the plurality of lens regions 21 has a function of individually converging the incident light to optical element 20 by each lens region 21.

In this embodiment, the plan-view shape of each lens region 21 is a rectangle having width W1 and width W2. In each lens region 21, width 1 is set to be greater than width W2 (W1>W2). Also, the areas of lens regions 21 are substantially equal. In addition, in this embodiment, the longitudinal direction of lens region 21 is the direction of coordinate axis 95, and the transverse direction of lens region 21 is the direction of coordinate axis 96. In other words, in each of the plurality of lens regions 21, the width in the direction of coordinate axis 96 (second axis) is smaller than the width in the direction of coordinate axis 95 (first axis).

It is to be noted that in this embodiment, although all of the plurality of lens regions 21 are rectangles in optical element 20, without being limited to this, part of the plurality of lens regions are rectangles, and the other part of the plurality of lens regions may be shapes other than rectangles.

Next, the function of the plurality of lens regions 21 (optical functional unit 22) in optical element 20 will be described using FIG. 3 and FIG. 4. FIG. 3 is a diagram for illustrating the function of lens region 21 in a longitudinal direction cross section, and illustrates a light focus state of excitation light 54 on a plane which is in IIB-IIB cross section in (a) of FIG. 2, and includes the optical axis of excitation light 54 (incident light 51). Also, FIG. 4 is a diagram for illustrating the function of lens region 21 in the transverse direction cross section, and illustrates a light focus state of excitation light 54 on a plane which is in IIC-IIC cross section in (a) of FIG. 2, and includes the optical axis of excitation light 54 (incident light 51).

Figure 3:
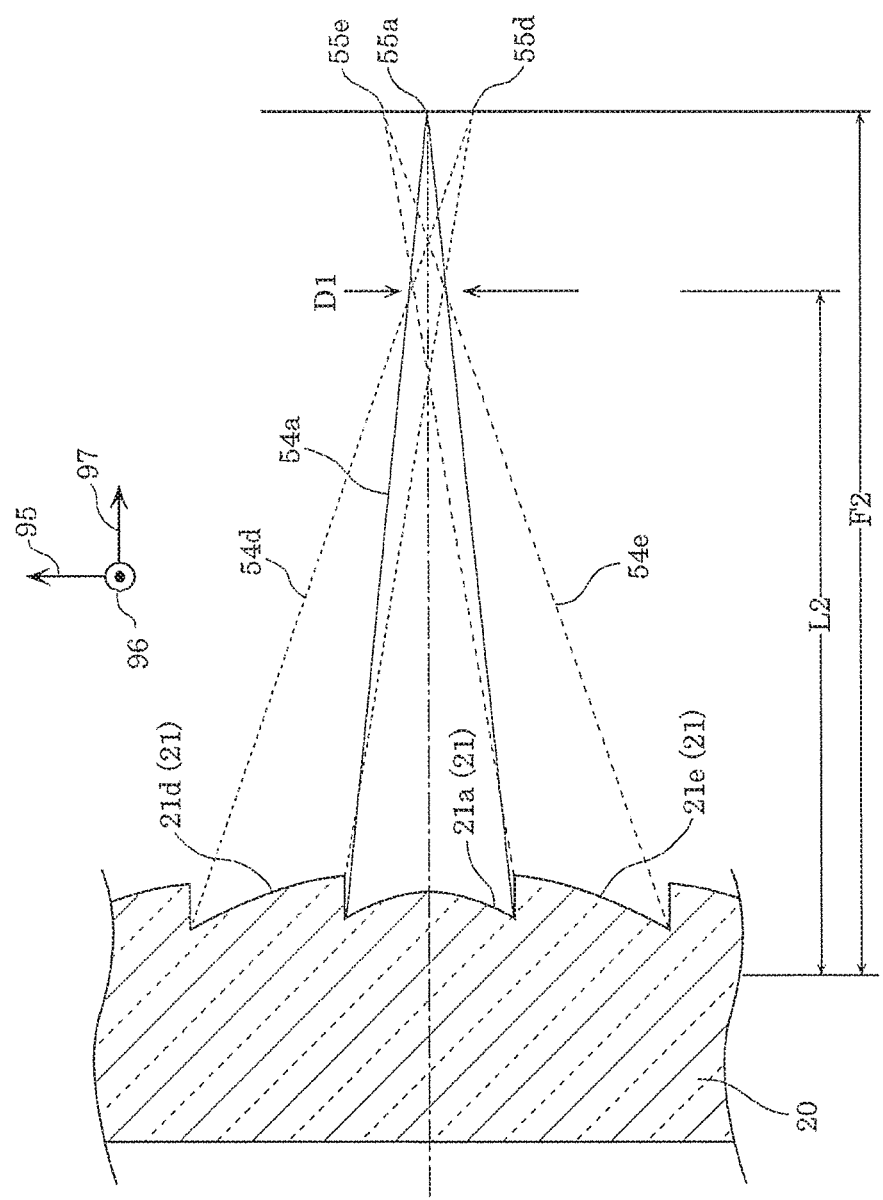
FIG. 3 is a diagram for illustrating the function (the function of lens regions in a longitudinal direction cross section) of a plurality of lens regions of the optical element of the light source device according to Embodiment 1 of the present disclosure.

As illustrated in FIG. 3, the plurality of lens regions 21 have mutually different first focal points (first focal point positions). First focal point of each of the plurality of lens regions 21 is located on a plane which is formed by coordinate axis 97 and coordinate axis 95, and includes the optical axis of excitation light 54. Also, first focal point of each of the plurality of lens regions 21 is located on a plane which is one of an infinite number of planes formed by coordinate axis 95 and coordinate axis 96, and is away from optical element 20 by distance F.

Specifically, central lens region 21a of the plurality of lens regions 21 has focal point 55a as first focal point at a position away from optical element 20 along the direction of coordinate axis 97 by a certain distance (distance F2), the position being in a plane formed by coordinate axis 97 and coordinate axis 95. Also, lens region 21d (the lens region formed adjacent to one side of lens region 21a in the direction of coordinate axis 95) out of the plurality of lens regions 21 has focal point 55d as first focal point at a position with distance F2 from optical element 20 in a plane formed by coordinate axis 97 and coordinate axis 95. Also, lens region 21e (the lens region formed adjacent to the other side of lens region 21a in the direction of coordinate axis 95) out of the plurality of lens regions 21 has focal point 55e as first focal point at a position with distance F2 from optical element 20 in a plane formed by coordinate axis 97 and coordinate axis 95.

Also, incident light to optical element 20 (incident light 51 of FIG. 1) is converged by each of the plurality of lens regions 21, and thereby the intensity distribution is changed, and is converted into excitation light 54 and emitted from the plurality of lens regions 21.

Specifically, as illustrated in FIG. 3, the incident light to central lens region 21a among the incident light to optical element 20 is converted into convergence light (excitation light 54a) which is converged to be focused on focal point 55a, by lens region 21a. Similarly, the incident light to central lens region 21d among the incident light to optical element 20 is converted into convergence light (excitation light 54d) which is converged to be focused on focal point 55d, by lens region 21d. Also, the incident light to central lens region 21e among the incident light to optical element 20 is converted into convergence light (excitation light 54e) which is converged to be focused on focal point 55e, by lens region 21e.

In this manner, the incident light to the plurality of lens regions 21 is converted into a plurality of convergence light beams having different focal points at a position with distance F2 from optical element 20, and emits as a plurality of excitation light beams from optical element 20.

In addition, the position of the focal point of each of the plurality of lens regions 21 is set so that the plurality of convergence light beams (excitation light) overlap with each other at a position with distance L2 from optical element 20. Specifically, the convergence light beams (excitation light 54a, 54d, and 54e) converged by lens regions 21a, 21d, and 21e overlap with each other at a position with distance L2 from optical element 20, and excitation light 54 with beam width (beam diameter) D1 is formed.

Fluorescent substance element 30 is disposed so that the light emitting surface (for instance, the major surface of the phosphor layer) which is the major surface of phosphor element 30 is located at a position with distance L2 from optical element 20. Therefore, the light emitting surface of phosphor element 30 is irradiated so that the plurality of convergence light beams emitted from the plurality of lens regions 21 are superimposed with beam width D1.

In this embodiment, a configuration is adopted in which F2>L2 so that first focal point of each of the plurality of lens regions 21 is present on the rear side (the far side) from the light emitting surface of phosphor element 30. In other words, phosphor element 30 is disposed so that the light emitting surface of phosphor element 30 is located between first focal point of each of the plurality of lens regions 21 and optical element 20. It is to be noted that a configuration may be adopted in which F2<L2 so that first focal point of each of the plurality of lens regions 21 is present on the front side (the near side) from the light emitting surface of phosphor element 30. The same effect is also obtained in this case.

In this manner, the light beams incident on the plurality of lens regions 21 and focused on first focal points overlap on the light emitting surface of phosphor element 30. Specifically, light beams incident on the plurality of lens regions 21a, 21d, and 21e, and converged to focal points 55a, 55d, and 55e overlap on the light surface of phosphor element 30.

It is to be noted that in this embodiment, lens regions 21 other than lens regions 21a, 21d, and 21e out of the plurality of lens regions 21 arranged along coordinate axis 95 also have the same function, and the light beams incident on the plurality of lens regions 21 and focused on first focal points overlap on the light emitting surface of phosphor element 30. In other words, in this embodiment, the light beams incident on the plurality of lens regions 21 arranged along coordinate axis 95 and focused overlap on the light emitting surface of phosphor element 30.

As illustrated in FIG. 1, in the transverse direction cross section, lens region 21 also has the function as in the longitudinal direction cross section.

Figure 4:
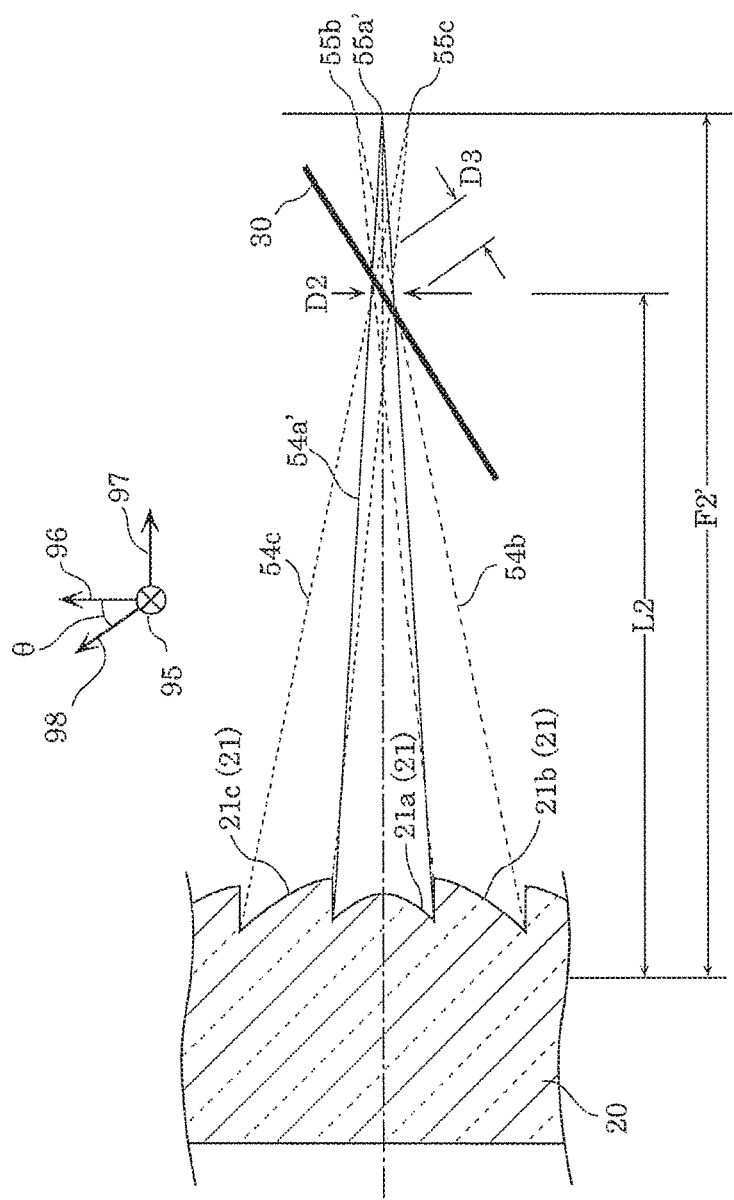
FIG. 4 is a diagram for illustrating the function (the function of lens regions in a transverse cross section) of a plurality of lens regions of a light source element of the light source device according to Embodiment 1 of the present disclosure.

As illustrated in FIG. 4, the plurality of lens regions 21 further have mutually different second focal points (second focal point positions). Second focal point of each of the plurality of lens regions 21 is located on a plane which is formed by coordinate axis 96 and coordinate axis 97, and includes the optical axis of excitation light 54. Also, second focal point of each of the plurality of lens regions 21 is located on a plane which is one of an infinite number of planes formed by coordinate axis 95 and coordinate axis 96, and is away from optical element 20 by distance F'.

Specifically, central lens region 21a of the plurality of lens regions 21 has focal point 55a' as second focal point at a position away from optical element 20 along the direction of coordinate axis 97 by a certain distance (distance F2'), the position being in a plane formed by coordinate axis 96 and coordinate axis 97. Also, lens region 21b (the lens region formed adjacent to one side of lens region 21a in the direction of coordinate axis 96) out of the plurality of lens regions 21 has focal point 55b as second focal point at a position with distance F2' from optical element 20 in a plane formed by coordinate axis 96 and coordinate axis 97. Also, lens region 21c (the lens region formed adjacent to the other side of lens region 21a in the direction of coordinate axis 96) out of the plurality of lens regions 21 has focal point 55c as second focal point at a position with distance F2' from optical element 20 in a plane formed by coordinate axis 96 and coordinate axis 97.

The incident light to central lens region 21a among the incident light to optical element 20 is converted into convergence light (excitation light 54a') which is converged to be focused on focal point 55a', by lens region 21a. Similarly, the incident light to central lens region 21b among the incident light to optical element 20 is converted into convergence light (excitation light 54b) which is converged to be focused on focal point 55b, by lens region 21b. Also, the incident light to central lens region 21c among the incident light to optical element 20 is converted into convergence light (excitation light 54c) which is converged to be focused on focal point 55c, by lens region 21c.

In this manner, even on a plane formed by coordinate axis 96 and coordinate axis 97, the incident light to the plurality of lens regions 21 is converted into a plurality of convergence light beams having different focal points at a position with distance F2' from optical element 20, and emits as a plurality of excitation light beams from optical element 20.

Also, even on a plane formed by coordinate axis 96 and coordinate axis 97, the position of the focal point of each of the plurality of lens regions 21 is set so that the plurality of convergence light beams (excitation light) overlap with each other at a position with distance L2 from optical element 20. Specifically, the convergence light beams (excitation light 54a', 54b, and 54c) converged by lens regions 21a, 21b, and 21c overlap with each other at a position with distance L2 from optical element 20, and excitation light 54 with beam width (beam diameter) D2 is formed.

Fluorescent substance element 30 is disposed so that the light emitting surface (the major surface) of phosphor element 30 is located at a position with distance L2 from optical element 20. Therefore, the light emitting surface of phosphor element 30 is irradiated so that the plurality of convergence light beams emitted from the plurality of lens regions 21 are superimposed with beam width D2.

Also, in this embodiment, as illustrated in FIG. 4, phosphor element 30 is disposed so that the normal line of the light emitting surface is matched to coordinate axis 96 and is rotated by angle θ around coordinate axis 95 as a rotational axis, and in a state where the normal line is inclined to match coordinate axis 97, convergence light beams (excitation light 54a', 54b, and 54c) converged by lens regions 21a, 21b, and 21c from beam width D2.

Thus, radiant light 91 (FIG. 1) having beam width D3 (D3>D2) is formed on the light emitting surface (major surface) of phosphor element 30 by the effect of inclination of phosphor element 30. It is to be noted that from the viewpoint of obtaining light having a uniform intensity distribution, beam width D1 and beam width D3 on the light emitting surface of phosphor element 30 are preferably formed to be substantially the same as beam width D1 and beam width D2 of light emission points, at which fluorescence of phosphor element 30 is generated, of the plurality of lens regions 21. In this case, beam width D2 can be made smaller than beam width D1 by setting division width W2 of the plurality of lens regions 21 to be smaller than division width W1, and beam width D1 and beam width D3 can be made substantially the same.

Also, in this embodiment, similarly to first focal point, a configuration adopted in which F2'>L2 so that second focal point of each of the plurality of lens regions 21 is present on the rear side (the far side) from the light emitting surface of phosphor element 30. In other words, phosphor element 30 is disposed so that the light emitting surface of phosphor element 30 is located between second focal point of each of the plurality of lens regions 21 and optical element 20. It is to be noted that a configuration may be adopted in which F2'<L2 so that second focal point of each of the plurality of lens regions 21 is present on the front side (the near side) from the light emitting surface of phosphor element 30. The same effect is also obtained in this case.

Also, in each of the plurality of lens regions 21, distance F2 to first focal point illustrated in FIG. 3 and distance F2' to second focal point illustrated in FIG. 4 may be different (F2≠F2'), or may be the same (F2=F2'). In other words, focal point 55a and focal point 55a' in lens region 21a may be different, or may be the same.

In this manner, similarly to the light focused on first focal point, the light beams incident on the plurality of lens regions 21 and focused on second focal point overlap on the light emitting surface of phosphor element 30. Specifically, light beams incident on the plurality of lens regions 21a, 21b, and 21c, and converged to focal points 55a', 55b, and 55c overlap on the light emitting surface of phosphor element 30.

It is to be noted that in this embodiment, lens regions 21 other than lens regions 21a, 21b, and 21c out of the plurality of lens regions 21 arranged along coordinate axis 96 also have the same function, and the light beams incident on the plurality of lens regions 21 and focused on second focal points overlap on the light emitting surface of phosphor element 30. In other words, in this embodiment, the light beams incident on the plurality of lens regions 21 arranged along coordinate axis 96 and focused overlap on the light emitting surface of phosphor element 30.

Figure 5:
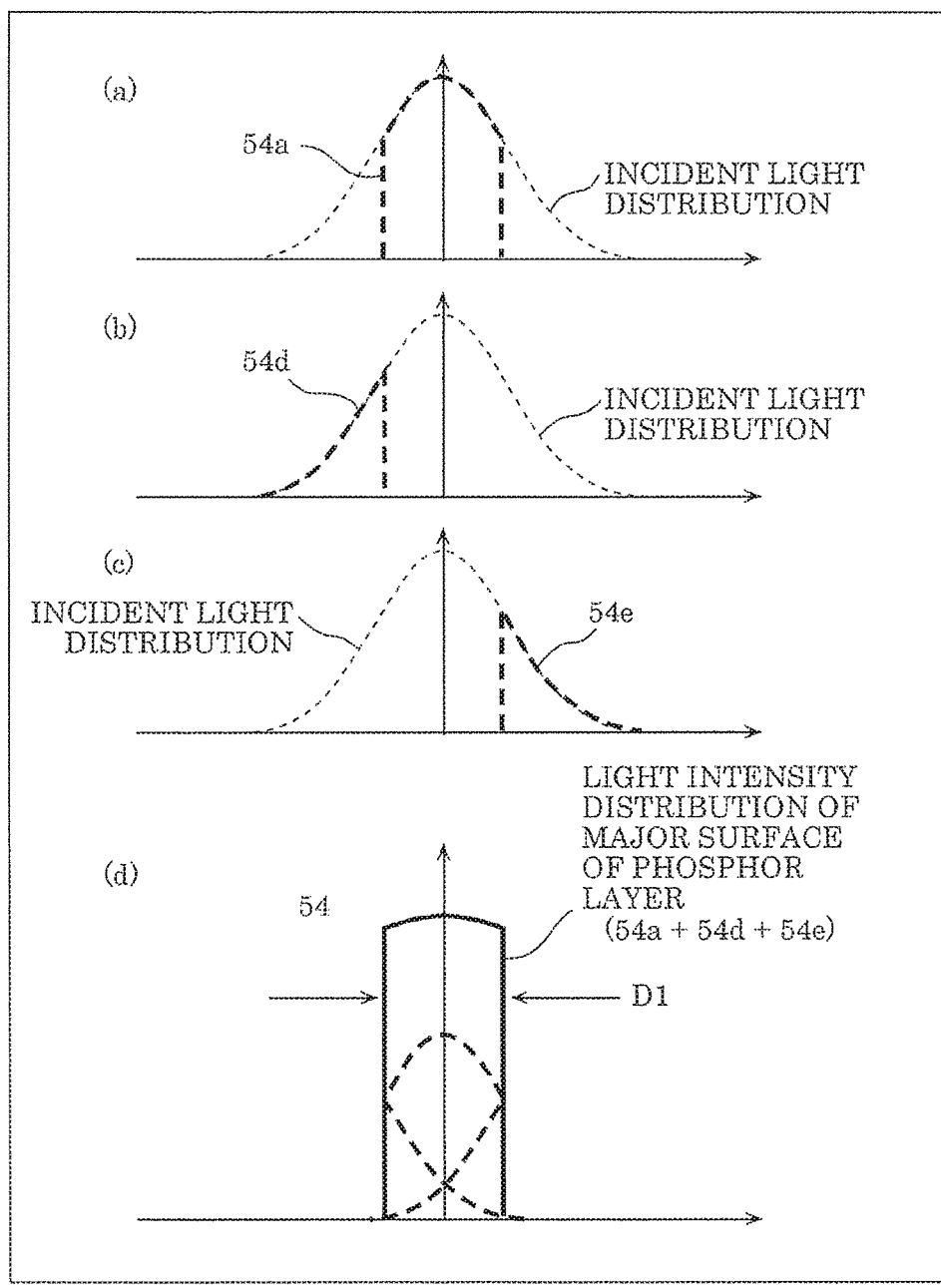
FIG. 5 is a diagram for illustrating a change in the intensity distribution of light passing through the optical element of the light source device according to Embodiment 1 of the present disclosure.

Next, the manner in which the intensity distribution of incident light 51 passing through lens region 21 (optical functional unit 22) of optical element 20 is changed will be described using FIG. 5. FIG. 5 is a diagram for illustrating a change in the intensity distribution of light passing through the optical element of the light source device according to Embodiment 1 of the present disclosure.

In FIG. 5, although the change in the intensity distribution when incident light 51 incident on the plurality of lens regions 21 becomes excitation light 54 and emits in the plane illustrated in FIG. 3 will be described, the same goes with the plane illustrated in FIG. 4. Although a description is given limited to 3 lens regions (21a, 21d, 21e) for the sake of convenience of description in FIG. 5, the same principle applies to the case of 5 lens regions as illustrated in FIG. 2.

In FIG. 5, thin dashed lines in (a) to (c) indicate the light intensity distribution (incident light distribution) of incident light 51 incident on the plurality of lens regions 21. The thick clashed line in (a) of FIG. 5 indicates the light intensity distribution (excitation light distribution) of excitation light 54a achieved by lens region 21a, the thick dashed line in (b) of FIG. 5 indicates the light intensity distribution (excitation light distribution) of excitation light 54d achieved by lens region 21d, and the thick dashed line in (c) of FIG. 5 indicates the light intensity distribution (excitation light distribution) of excitation light 54e achieved by lens region 21e.

As illustrated in (a) to (c) of FIG. 5, each of excitation light 54a, 54d, and 54e has such a light intensity distribution that divides the incident light distribution to the plurality of lens regions 21.

In this embodiment, it is set that respective excitation light beams 54a, 54d, and 54e emitted from the plurality of lens regions 21 propagate with convergence light having different focal points, and overlap on the light emitting surface of phosphor element 30. Thus, as illustrated in (d) of FIG. 5, the light intensity distributions (excitation light distributions) of excitation light 54a, 54d, and 54e overlap with each other and averaged on the light emitting surface of phosphor element 30, thus the light intensity distribution as entire excitation light 54 is uniformized. In this case, as illustrated in (d) of FIG. 5, the light intensity distribution of excitation light 54 has a shape corresponding to beam width D1 on the light emitting surface of phosphor element 30.

Although a description is given limited to 3 lens regions 21 in this embodiment as described above, it is actually designed that excitation light beams from more lens regions 21 overlap, thus the effect of averaging of the light intensity distribution is further increased. That is, as the number of divided lens regions is increased, excitation light 54 having a more uniform light intensity distribution can be obtained.

With light source device 1 above in this embodiment, the light emitted from semiconductor light emitting element 11 can be efficiently converted into light having a uniform light intensity distribution. Therefore, decrease in the light emission efficiency of phosphor element 30 due to heat generation by excitation light 54 can be reduced. In addition, excitation light 54 having a uniform light intensity distribution can be formed without using an optical rod or the like, and thus a compact light source device can be achieved.

Modification 1 of Embodiment 1

Figure 6:
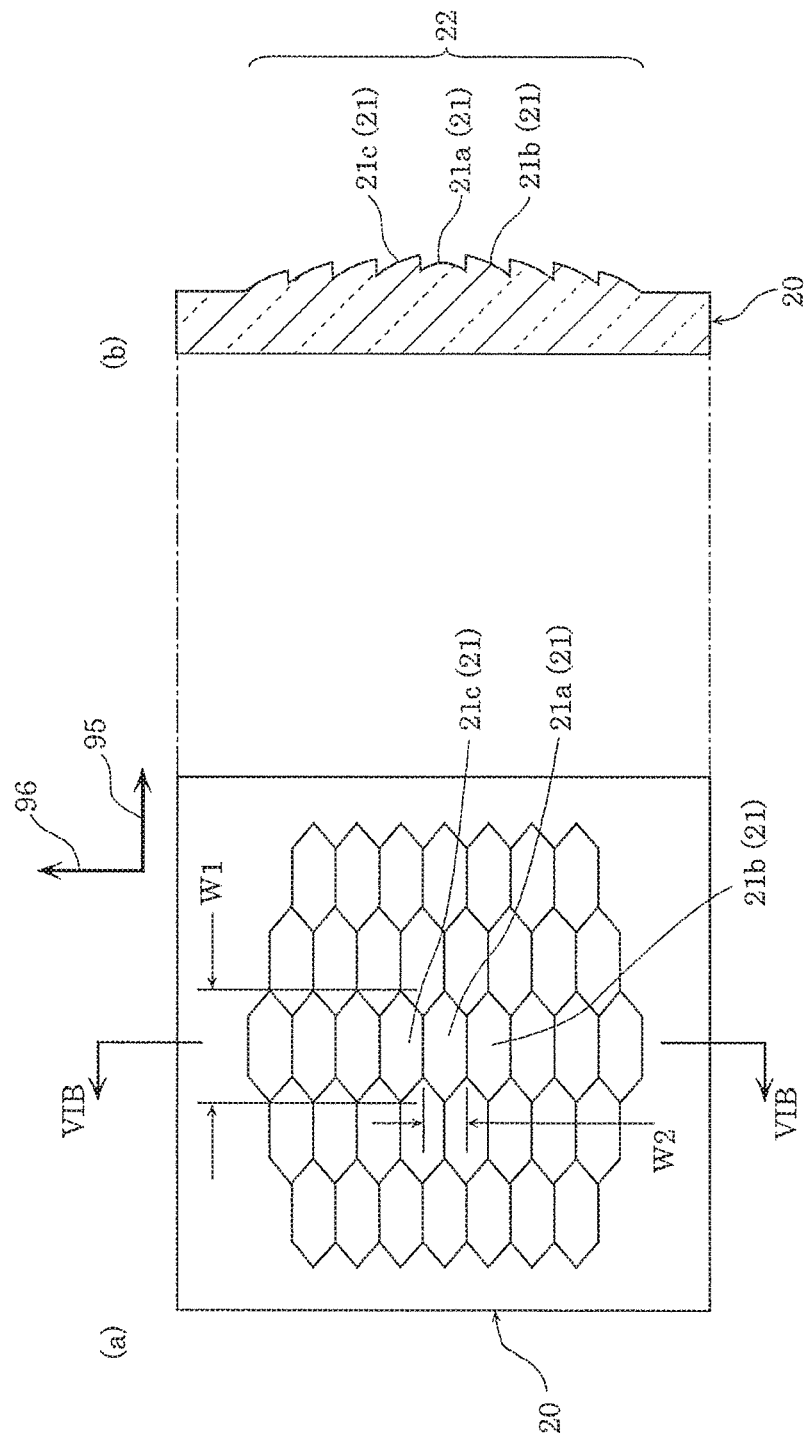
FIG. 6 is a diagram illustrating the configuration of an optical element in a light source device according to Modification 1 of Embodiment 1 of the present disclosure.

Modification 1 of Embodiment 1 of the present disclosure will be described using FIG. 6. FIG. 6 is a diagram illustrating the configuration of optical element 20 in a light source device according to Modification 1 of Embodiment 1 of the present disclosure. (a) of FIG. 6 is a plan view of optical element 20 in this modification, and (b) of FIG. 6 is a sectional view in VIB-VIB in (a) of FIG. 6. It is to be noted that in this modification, the components other than optical element 20 are the same as the components of source device 1 in Embodiment 1 described above.

As illustrated in (a) and (b) of FIG. 6, similarly to optical element 20 in Embodiment 1, optical element 20 in this modification has a plurality of lens regions 21 (21a, 21b, 21c, ...) which are a plurality of divided regions as optical functional unit 22 to change the intensity distribution of emission light 51 emitted from semiconductor light emitting element 11. Also in this modification, the plurality of lens regions 21 are divided in the direction of coordinate axis 95 (first axis) and the direction of coordinate axis 96 (second axis).

In contrast, this modification differs from Embodiment 1 in the plan-view shape of each lens region 21. Specifically, although the plan-view shape of each of the plurality of lens regions 21 in Embodiment 1 described above is a rectangle, the plan-view shape of each of the plurality of lens regions 21 in this modification is a hexagon. Specifically, the plan-view shape of each lens region 21 in this modification is a hexagon, and width W2 in the direction of coordinate axis 96 is set to be smaller than width W1 in the direction of coordinate axis 95.

It is to be noted that as illustrated in (b) of FIG. 6, the cross sectional shape of optical element 20 in this modification is the same as the cross sectional shape of optical element 20 in Embodiment 1 illustrated in (b) of FIG. 2. Although not illustrated, the cross sectional shape of optical element 20 in this modification in a plane including coordinate axes 95 and 97 is the same as the cross sectional shape of optical element 20 in Embodiment 1 illustrated in (c) of FIG. 2.

Optical element 20 in this modification also has the same function as the function of optical element 20 in Embodiment 1. Specifically, also in this modification, it is set that respective excitation light beams emitted from the plurality of lens regions 21 propagate with convergence light having different focal points, and overlap on the light emitting surface of phosphor element 30. Consequently, the light intensity distribution of the entire excitation light emitted from optical element 20 is uniformized.

Consequently, even with light source device in this modification, the light emitted from semiconductor light emitting element 11 can be efficiently converted into light having a uniform light intensity distribution. Since it is not necessary to use an optical rod or the like, a compact light source device can be achieved.

In addition, in this modification, since the plan-view shape of each of the plurality of lens regions 21 in optical element 20 is a hexagon, the beam shape of excitation light on the light emitting surface of phosphor element 30 can be made further closer to a circle, and thus the region not functioning as a lens can be reduced. Consequently, emission light 51 of semiconductor light emitting element 11 can be efficiently converted into excitation light 54 by optical element 20, and the luminance distribution of radiant light 91 of phosphor element 30 can be made further closer to a circle.

Modification 2 of Embodiment 1

Figure 7:
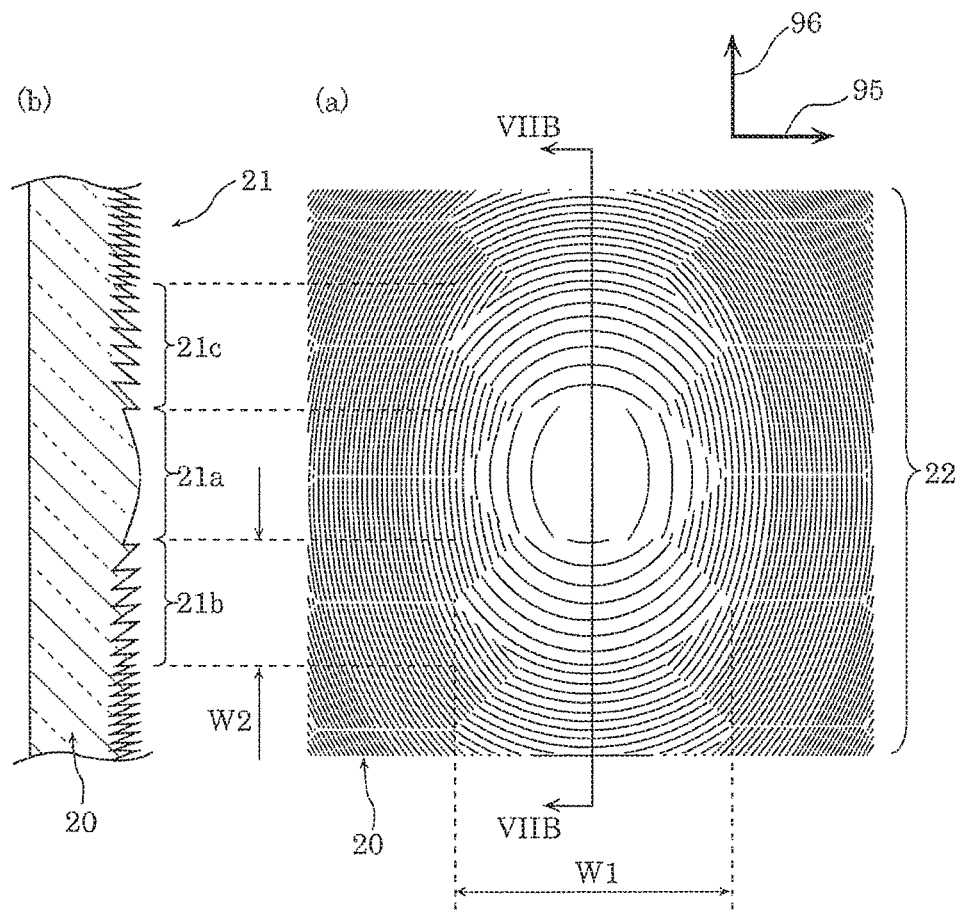
FIG. 7 is a diagram illustrating the configuration of an optical element in a light source device according to Modification 2 of Embodiment 1 of the present disclosure.

Modification 2 of Embodiment 1 of the present disclosure will be described using FIG. 7. FIG. 7 is a diagram illustrating the configuration of optical element 20 in a light source device according to Modification 2 of Embodiment 1 of the present disclosure. (a) of FIG. 7 is a plan view of optical element 20 in the present modification, and (b) FIG. 7 is a cross sectional view in VIIB-VIIB in (a) of FIG. 7. It is to be noted that in this modification, the components other than optical element 20 are the same as the components of source device 1 in Embodiment 1 described above.

As illustrated in (a) and (b) of FIG. 7, to optical element 20 in Embodiment 1, optical element 20 in this modification has a plurality of lens regions 21 (21a, 21b, 21c, ...) which are a plurality of divided regions as optical functional unit 22 to change the intensity distribution of emission light 51 emitted from semiconductor light emitting element 11.

Unlike Embodiment 1 described above, in this modification, each of the plurality of lens regions 21 is a Fresnel lens, however, optical element 20 in this modification also has the same function as the function of optical element 20 in Embodiment 1. Specifically, also in this modification, it is set that respective excitation light beams emitted from the plurality of lens regions 21 propagate with convergence light having different focal points, and overlap on the light emitting surface of phosphor element 30. Consequently, the light intensity distribution of the entire excitation light emitted from optical element 20 is uniformized.

Consequently, even with light source device in this modification, the light emitted from semiconductor light emitting element 11 can be efficiently converted into light having a uniform light intensity distribution. Since it is not necessary to use an optical rod or the like, a compact light source device can be achieved.

Moreover, in this modification, each of the plurality of lens regions 21 is a Fresnel lens. Thus, in contrast to Embodiment 1 described above, the thickness of optical functional unit 22 can be made thin, and the thickness of optical element 20 itself can also be made thin. As a consequence, the distance from semiconductor light emitting element 11 to phosphor element 30 can be reduced, and thus further miniaturization of the light source device can be achieved.

Modification 3 of Embodiment 1

Figure 8:
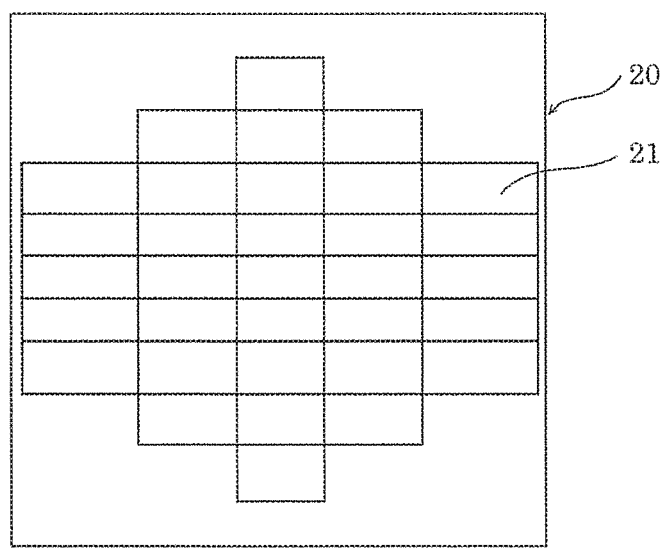
FIG. 8 is a diagram illustrating the configuration of an optical element in a light source device according to Modification 3 of Embodiment 1 of the present disclosure.

Modification 3 of Embodiment 1 of the present disclosure will be described using FIG. 8. FIG. 8 is a diagram illustrating the configuration of optical element 20 in a light source device according to Modification 3 of Embodiment 1 of the present disclosure. Also in this modification, the components other than optical element 20 are the same as the components of source device 1 in Embodiment 1 described above.

Similarly to optical element 20 in Embodiment 1, optical element 20 in this modification has plurality of lens regions 21 which are a plurality of divided regions. Although the plan-view shape of each lens region 21 is a rectangle similarly to Embodiment 1, the plurality of lens regions 21 are formed to have respective different areas in this modification.

Optical element 20 in this modification also has the same function as the function of optical element 20 in Embodiment 1. Specifically, also in this modification, it is set that respective excitation light beams emitted from the plurality of lens regions 21 propagate with convergence light having different focal points, and overlap on the light emitting surface of phosphor element 30. Consequently, the light intensity distribution of the entire excitation light emitted from optical element 20 is uniformized.

Consequently, even with light source device in this modification, the light emitted from semiconductor light emitting element 11 can be efficiently converted into light having a uniform light intensity distribution. Since it is not necessary to use an optical rod or the like, a compact light source device can be achieved.

Moreover, in this modification, the plurality of lens regions 21 are formed to have respective different areas in this modification. Consequently, the region not functioning as a lens can be reduced, and it can be designed that the light intensity distribution of excitation light 54 with which phosphor element 30 is irradiated is further uniformized. Therefore, decrease in the light emission efficiency of phosphor element 30 due to heat generation by excitation light can be further reduced.

Figure 9:
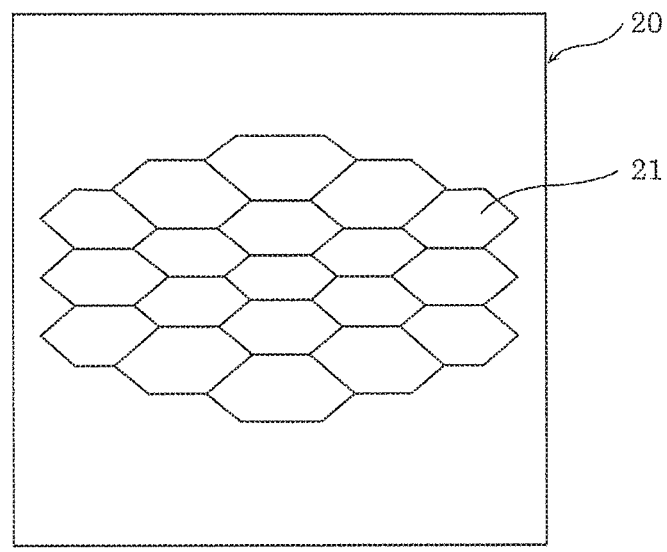
FIG. 9 is a diagram illustrating another configuration of an optical element in a light source device according to Modification 3 of Embodiment 1 of the present disclosure.

It is to be noted that in this modification, although the plan-view shape of the plurality of lens regions 21 is a rectangle as illustrated in FIG. 8, the plan-view shape of the plurality of lens regions 21 may be a hexagon as illustrated in FIG. 9. Thus, the spot shape of excitation light 54 on the light emitting surface of phosphor element 30 can be made further closer to a circle.

Embodiment 2

Figure 10:
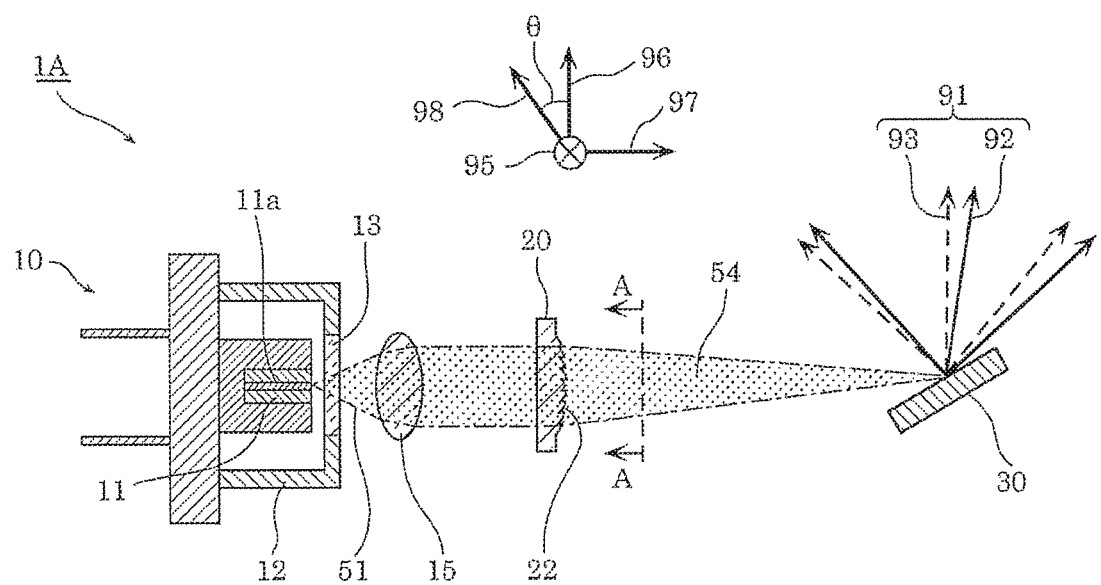
FIG. 10 is a diagram illustrating the configuration of a light source device according to Embodiment 2 of the present disclosure.

Next, light source device 1A according to Embodiment 2 of the present disclosure will be described using FIG. 10. FIG. 10 is a diagram illustrating the configuration of light source device 1A according to Embodiment 2 of the present disclosure.

The point of difference between light source device 1A in this embodiment and light source device 1 in Embodiment 1 illustrated in FIG. 1 is the arrangement direction (orientation) of semiconductor light emitting element 11. In this embodiment, semiconductor light emitting device 10 is disposed at a position rotated 90 degrees around the optical axis of emission light 51.

Specifically, in Embodiment 1 described above, semiconductor light emitting element 11 is disposed so that the direction of the stripe width of optical waveguide 11a matches the direction of coordinate axis 95, however, in this embodiment, semiconductor light emitting element 11 is disposed so that the direction of the stripe width of optical waveguide 11a matches the direction of coordinate axis 96. In other words, in this embodiment, semiconductor light emitting element 11 is disposed so that the longitudinal direction (the stripe direction) of optical waveguide 11a matches the direction of coordinate axis 97. It is to be noted that in this embodiment, the light source device is the same as light source device 1 in Embodiment 1 described above other than the arrangement direction (orientation) of semiconductor light emitting element 11.

Here, the radiation angle of emission light emitted from semiconductor light emitting element 11 is different between the direction of coordinate axis 95 and the direction of coordinate axis 96. In general, in semiconductor light emitting element 11 having optical waveguide 11a, the radiation angle of emission light emitted in the direction of the stripe width is small, and the radiation angle of emission light emitted in the direction perpendicular to the stripe width direction is large. For instance, in FIG. 10, emission light 51 from semiconductor light emitting element 11 has a narrow optical distribution width in A-A direction (the direction of coordinate axis 96), and twice the optical distribution width or greater in the direction (the direction of coordinate axis 95) perpendicular to A-A direction.

The configuration of optical element 20 in this embodiment is the same as the configuration of optical element 20 in Embodiment 1 described above illustrated in FIG. 2. Also, optical element 20 in Modification 1, Modification 2, and Modification 3 of Embodiment 1 may be used. In other words, in FIG. 10, for A-A direction of optical element 20, that is, for IIC-IIC direction in FIG. 2, VIB-VIB direction in FIG. 6, and VIIB-VIIB direction in FIG. 7, each lens region 21 is designed so that width W2 is smaller than width W1. In short, in each lens region 21, the width in the direction of coordinate axis 96 is smaller than the width in the direction of coordinate axis 95.

Thus, in this embodiment, the plurality of lens regions 21 are formed so that A-A direction with a narrow incident light distribution width corresponds to narrow width (W2) of the plurality of lens regions 21 of optical element 20, and the direction (the direction perpendicular to A-A) with a wider incident light distribution width corresponds to wide width (W1).

Consequently, in this embodiment, emission light 51 emitted from semiconductor light emitting element 11 enters the plurality of lens regions 21 so that the direction with a narrow radiation angle corresponds to the narrow width (coordinate axis 96) of each lens region 21.

Also in light source device LA above in this embodiment, it is set that respective excitation light beams emitted from the plurality of lens regions 21 propagate with convergence light having different focal points, and overlap on the light emitting surface of phosphor element 30. Consequently, the light intensity distribution of the entire excitation light emitted from optical element 20 is uniformized.

Consequently, even with light source device in this modification, the light emitted from semiconductor light emitting element 11 can be efficiently converted into light having a uniform light intensity distribution. Since it is not necessary to use an optical rod or the like, a compact light source device can be achieved.

Furthermore, in this embodiment, emission light 51 with a narrow radiation angle emitted from semiconductor light emitting element 11 corresponds to the narrow width of each lens region 21.

With this configuration, it is possible to increase the number of effective lens regions 21 that effect on the intensity distribution (incident light distribution) of incident light 51 of semiconductor light emitting element 11. Consequently, the number of converted excitation light beams corresponding to lens regions 21 is increased, and the number of excitation light beams overlapping on the light emitting surface of phosphor element 30 is increased. Therefore, the light intensity distribution is averaged by more excitation light beams, and thus excitation light 54 having a more uniform light intensity distribution can be obtained.

Embodiment 3

Figure 11:
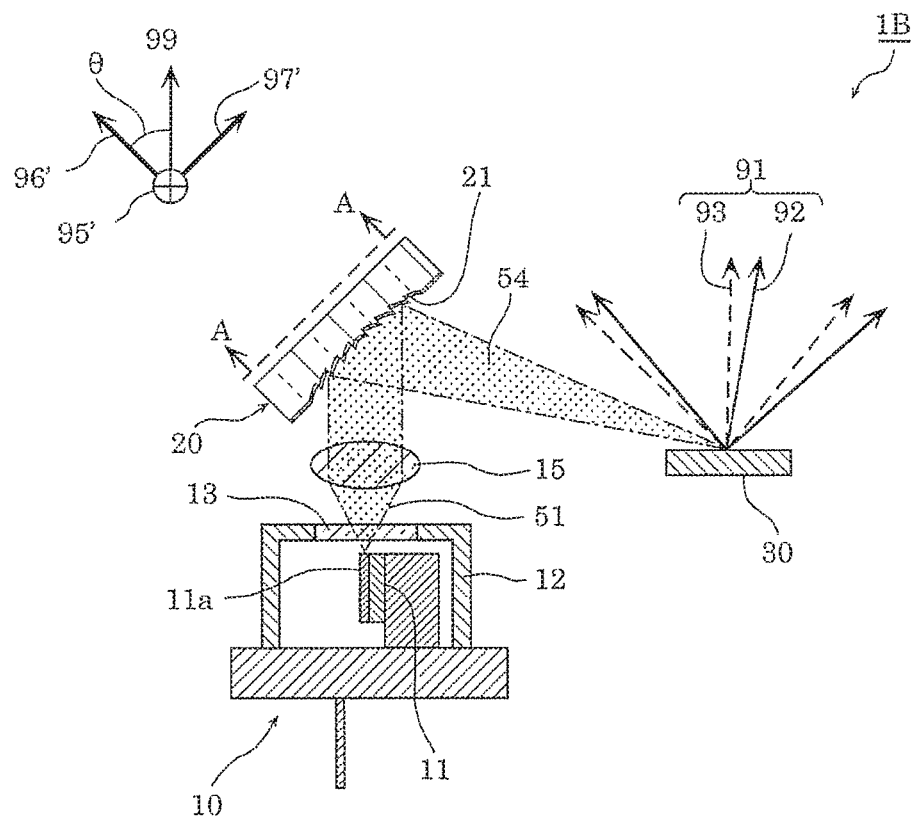
FIG. 11 is a diagram illustrating the configuration of a light source device according to Embodiment 3 of the present disclosure.
Figure 12:
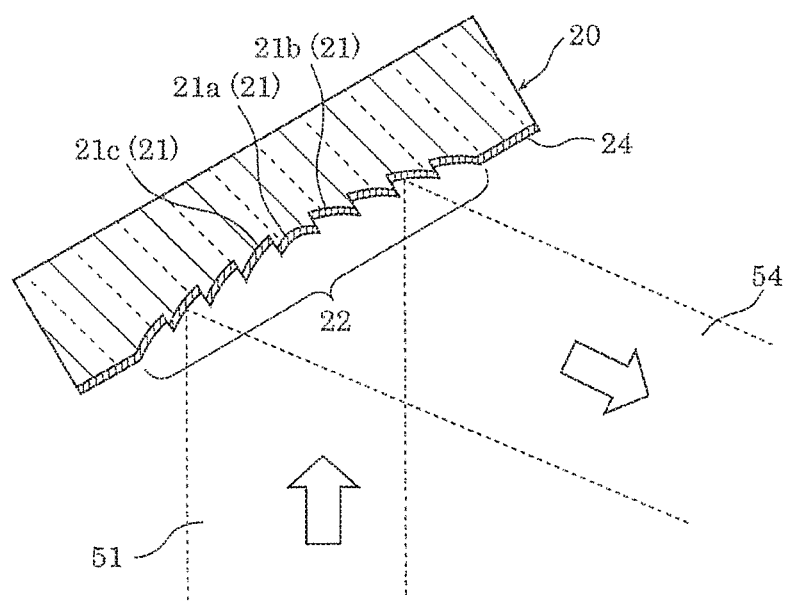
FIG. 12 is a diagram illustrating the configuration and function of an optical element in the light source device according to Embodiment 1 of the present disclosure.

Next, light source device 1B according to Embodiment 3 of the present disclosure swill be described using FIG. 11 and FIG. 12. FIG. 11 is a diagram illustrating the configuration of light source device 1B according to Embodiment 3 of the present disclosure. FIG. 12 is a diagram illustrating the configuration and function of optical element 20 in light source device 1B.

As illustrated in FIG. 11, semiconductor light emitting element 11 is disposed so that the direction of the stripe width of optical waveguide 11a matches the direction of coordinate axis 95', and emission light 51 emits from semiconductor light emitting element 11 in the direction of coordinate axis 99.

In this embodiment, similarly to Embodiment 1, the plurality of lens regions 21 having different focal points are formed on the plane of incidence of optical element 20. Similarly to first focal point and second focal point of each lens region 21 in Embodiment 1, the respective focal points of the plurality of lens regions 21 may be different or may be the same in two planes perpendicular to each other.

Also unlike Embodiment 1, in this embodiment, optical element 20 is disposed so that the normal line of optical element 20 is inclined by angle θ around coordinate axis 95' as a rotational axis with respect to the optical axis (coordinate axis 99) of emission light 51 of semiconductor light emitting device 10.

Incident light 51 to optical element 20 is reflected and focused by the plurality of lens regions 21, and becomes excitation light 54, with which phosphor element 30 is irradiated. Since the excitation light beams corresponding to lens regions 21 overlap with each other on the light emitting surface of phosphor element 30, the light intensity distributions of the excitation light beams are averaged on the light emitting surface of phosphor element 30. Consequently, entire excitation light 54 generated by optical element 20 has a uniform light intensity distribution.

It is to be noted that in this embodiment, in order to increase reflection of emission light 51 from semiconductor light emitting element 11, reflection film 24 is formed on the plane of incidence of optical element 20. Reflection film 24 is composed of a plurality of dielectric materials having different refractive indices, for instance. For instance, reflection film 24 is formed by stacking multiple layers of materials such as $SiO_2$, $TiO_2$, $Ta_2O_5$, $Nb_2O_5$ by a sputter device or a deposition device. Alternatively, reflection film 24 may be composed of metal having a high optical reflectivity, for instance, Ag, Cu, Au, Al, or an alloy of these.

Also, phosphor element 30 is disposed so that the normal direction of the light emitting surface (major surface) substantially matches coordinate axis 99. Although phosphor element 30 may be disposed in an inclined manner as in Embodiment 1, radiant light 91 can be emitted in a direction perpendicular to a reference plane by disposing phosphor element 30 as in this embodiment. Thus, from the viewpoint of constructing a light source device, it is preferable to dispose phosphor element 30 as in this embodiment.

It is to be noted that the incidence angle of incident angle 51 incident on phosphor element 30 can be adjusted by rotation angle θ of optical element 20. In order to take more radiant light 91 from the phosphor element, it is preferable that rotation angle θ be less than 45 degrees, and it is more preferable that rotation angle θ be set between 30 degrees and 40 degrees.

Similarly to Embodiment 1, the plurality of lens regions 21 are a plurality of divided regions, and may be any of rectangles (FIG. 2), hexagons (FIG. 6), hexagonal Fresnel lenses (FIG. 7), rectangles with different areas (FIG. 8), and hexagons with different areas (FIG. 9).

Although each of the plurality of lens regions 21 has different widths in two perpendicular directions, it is preferable that lens regions 21 are disposed so that the narrower width corresponds to A-A direction illustrated in FIG. 11. With such disposition, the region not functioning as a lens can be reduced in the plurality of lens regions 21, and thus emission light 51 from semiconductor light emitting element 11 can be efficiently converted into excitation light 54. Thus, phosphor element 30 can be irradiated with excitation light 54 having a more uniform light intensity distribution.

Also in light source device 1B above in this embodiment, it is set that respective excitation light beams emitted from the plurality of lens regions 21 propagate with convergence light having different focal points, and overlap on the light emitting surface of phosphor element 30. Consequently, the light intensity distribution of the entire excitation light 54 emitted from optical element 20 is uniformized.

Consequently, even with light source device in this modification, the light emitted from semiconductor light emitting element 11 can be efficiently converted into light having a uniform light intensity distribution.

Furthermore, in this embodiment, the light emitted from semiconductor light emitting element 11 is reflected by optical element 20, and excitation light 54 is formed. Thus, the distance between semiconductor light emitting device 10 and phosphor element 30 can be further reduced, and thus further miniaturization of the light source device can be achieved.

Modification of Embodiment 3

Figure 13:
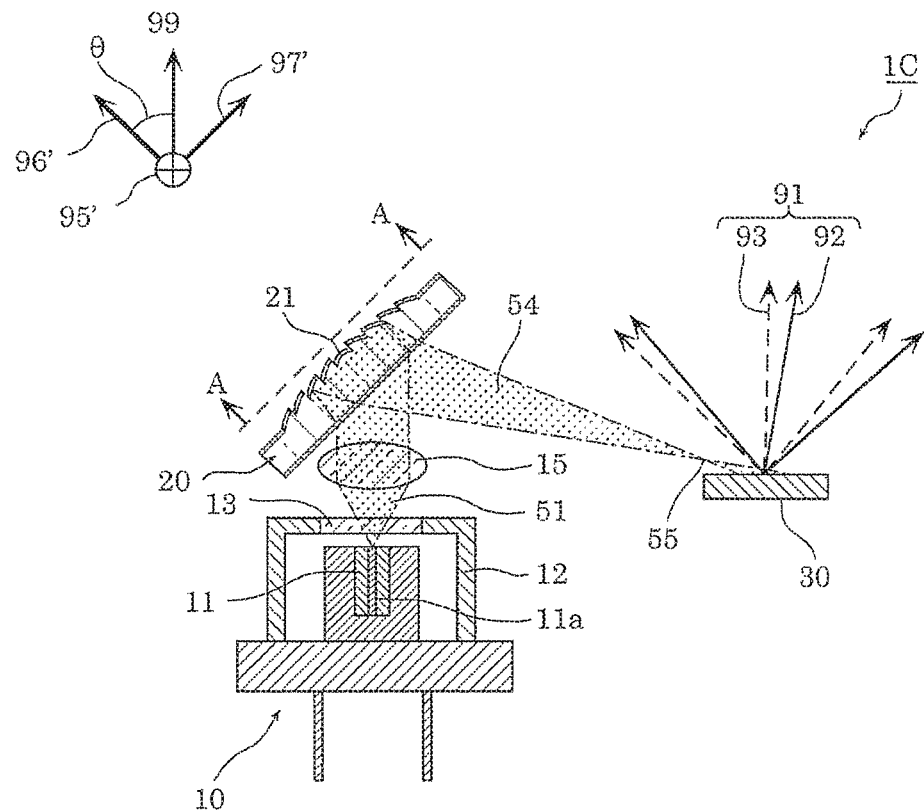
FIG. 13 is a diagram illustrating the configuration of a light source device according to a modification of Embodiment 3 of the present disclosure.
Figure 14:
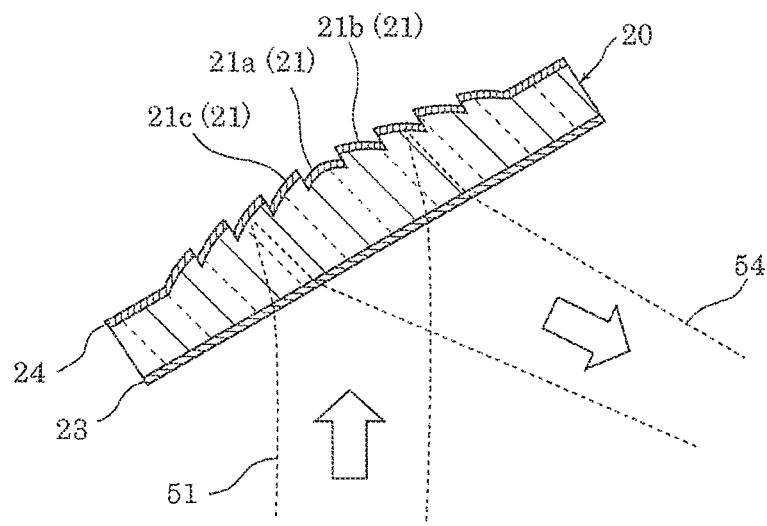
FIG. 14 is a diagram illustrating the configuration and function of an optical element in the light source device according to the modification of Embodiment 3 of the present disclosure.

A modification of Embodiment 3 of the present disclosure will be described using FIG. 13 and FIG. 14. FIG. 13 is a diagram illustrating the configuration of light source device 1C according to a modification of Embodiment 3 of the present disclosure. FIG. 14 is a diagram illustrating the configuration and function of optical element 20 in light source device 1C.

As illustrated in FIG. 13, in light source device 1C in this modification, the arrangement orientation of semiconductor light emitting device 10 is changed in light source device 1B of Embodiment 3 illustrated in FIG. 11.

Specifically, semiconductor emission device 10 in this modification is disposed at a position for which the arrangement orientation of semiconductor light emitting device 10 in FIG. 11 is rotated 90 degrees around the optical axis of emission light 51. In other words, in Embodiment 3 described above, semiconductor light emitting element 11 is disposed so that the direction of the stripe width of optical waveguide 11a matches the direction of coordinate axis 95'. However, in this modification, semiconductor light emitting element 11 is disposed so that the direction of the stripe width of optical waveguide 11a matches the direction perpendicular to a plane formed by coordinate axis 95' and coordinate axis 99.

Also, in optical element 20 in this modification, the plurality of lens regions 21 having focal points different from each other are formed on the surface (the surface, opposed to the plane of incidence, of optical element 20) on the opposite side of the plane of incidence, to which emission light 51 from semiconductor light emitting device 10 is incident.

Focal point 55 of each of the plurality of lens regions 21 is set on the front side (the near side) of phosphor element 30. Similarly to first focal point and second focal point of each lens region 21 in Embodiment 1, respective focal points 55 of the plurality of lens regions 21 may be different or may be the same in two planes perpendicular to each other.

Also, all of the same components as those described in Embodiment 3 are applicable to the components of the plurality of lens regions 21. In this case, lens regions 21 may be disposed so that the narrower side thereof corresponds to A-A direction.

As illustrated in FIG. 14, antireflection film 23 is formed on the plane of incidence of optical element 20 to reduce the reflection of emission light 51 from semiconductor light emitting device 10. On the other hand, reflection film 24 is formed on the surface of the plurality of lens regions 21 formed on the opposite side of the plane of incidence of optical element 20.

Antireflection film 23 and reflection film 24 are composed of a plurality of dielectric materials having different refractive indices, for instance. For instance, antireflection film 23 and reflection film 24 are formed by stacking multiple layers of materials such as $SiO_2$, $TiO_2$, $Ta_2O_5$, $Nb_2O_5$ by a sputter device or a deposition device. It is to be noted that reflection film 24 may be composed of metal having a high optical reflectivity, for instance, Ag, Cu, Au, Al, or an alloy of these.

Optical element 20 is configured in this manner, and thus emission light 51 from semiconductor light emitting element 11 efficiently enters optical element 20, and is focused and reflected by the plurality of lens regions 21 and reflection film 24 efficiently, and is emitted to phosphor element 30 as excitation light 54.

In this case, in this modification, as illustrated in FIG. 13, excitation light 54, which propagates to phosphor element 30, is once focused at focal point 55 located in front of phosphor element 30, and becomes divergent light, with which the light emitting surface of phosphor element 30 is irradiated.

Also in light source device 1C above in this modification, it is set that respective excitation light beams emitted from the plurality of lens regions 21 propagate with convergence light having different focal points, and overlap on the light emitting surface of phosphor element 30. Consequently, the light intensity distribution of the entire excitation light emitted from optical element 20 is uniformized.

Consequently, even with light source device in this modification, the light emitted from semiconductor light emitting element 11 can be efficiently converted into light having a uniform light intensity distribution. Since it is not necessary to use an optical rod or the like, a compact light source device can be achieved.

Embodiment 4

Figure 15:
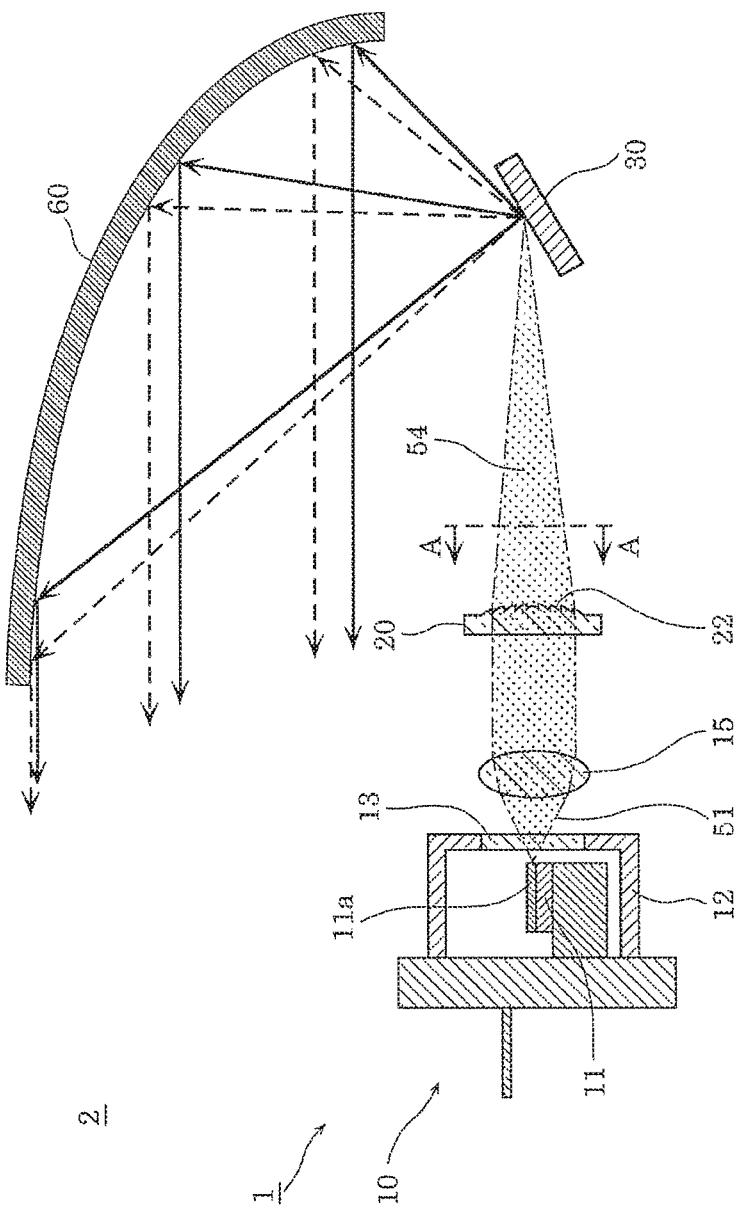
FIG. 15 is a diagram illustrating a configuration of a projection device according to Embodiment 4 of the present disclosure.
Figure 16:
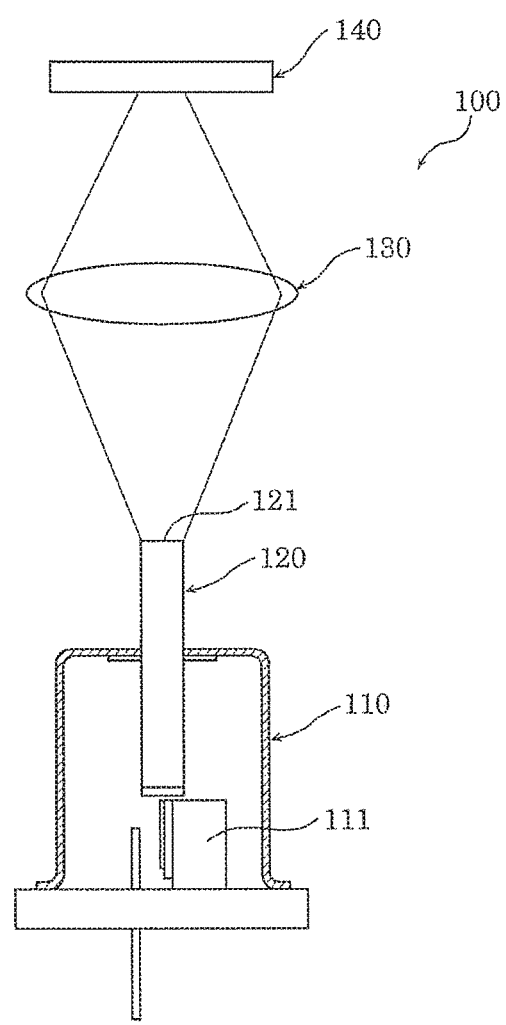
FIG. 16 is a diagram illustrating the configuration of a conventional light source device.
Figure 17:
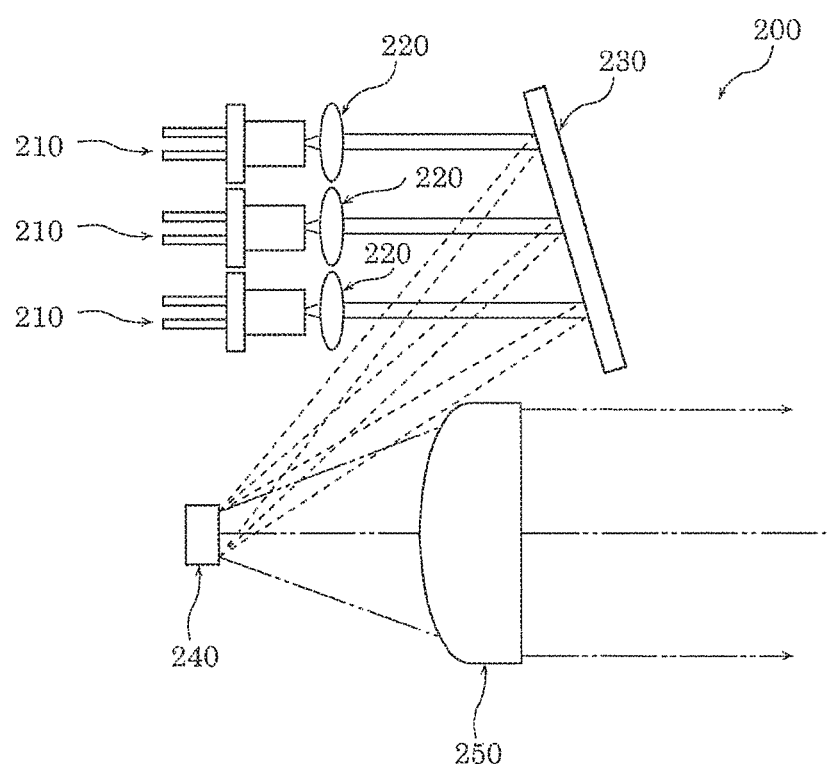
FIG. 17 is a diagram illustrating the configuration of another conventional light source device.

Next, projection device 2 according to Embodiment 4 of the present disclosure will be described using FIG. 15. FIG. 15 is a diagram illustrating a configuration of projection device 2 according to Embodiment 4 of the present disclosure.

Projection device 2 is, for instance, a lighting tool for vehicle headlight, and includes light source device 1 in Embodiment 1, and reflector 60. Reflector 60 is a reflecting member for changing the radiant angle of radiant light 91 from light source device 1 for forward projection.

Since projection device 2 in this embodiment uses light source device 1 in Embodiment 1, a compact projection device can be achieved.

It is to be noted that in this embodiment, although light source device 1 in Embodiment 1 is used, without being limited to this, for instance, the light source device in each modification of Embodiment 1, or in Embodiment 2 or Embodiment 3 may be used as the light source for projection device 2.

Other Modifications

Although the light source device and the projection device according to the present disclosure have been described above based on the embodiments and modifications, the present disclosure is not limited to the embodiments and modifications described above. For instance, an embodiment obtained by applying various modifications which may occur to those skilled in the art to each embodiment and modification, and an embodiment which is implemented by combining components and functions of each embodiment and modification in any manner without departing from the essence of the present disclosure are also included in the present disclosure.

INDUSTRIAL APPLICABILITY

The present disclosure is widely applicable to various optical devices, such as a light source device having a semiconductor light emitting element and a phosphor element, and a projection device using the light source device.

What is claimed is:

1. A light source device comprising:
   a laser element;
   an optical element that has a plurality of lens regions which are a plurality of divided regions, and that changes an intensity distribution of light emitted from the laser element, by the plurality of lens regions; and
   a phosphor element that emits light having, as excitation light, the light which has had the intensity distribution changed by the optical element,
   wherein the phosphor element is disposed so that a light emitting surface of the phosphor element is inclined with respect to a plane having an optical axis of the excitation light as a normal line,
   the plurality of lens regions have respective first focal points different from each other, and
   light beams incident on the plurality of lens regions and focused on the first focal points overlap on the light emitting surface of the phosphor element.

2. The light source device according to claim 1,
   wherein the respective first focal points of the plurality of lens regions are present forward or rearward of the light emitting surface of the phosphor element.

3. The light source device according to claim 1,
   wherein the plurality of lens regions are divided in a direction of a first axis and in a direction of a second axis perpendicular to the first axis, and
   the first focal points are located on a plane which is formed by a third axis perpendicular to the first axis and the second axis, and the first axis, the plane including the optical axis of the excitation light.

4. The light source device according to claim 3,
   wherein the plurality of lens regions further have respective second focal points different from each other,
   the second focal points are located on a plane which is formed by the second axis and the third axis, the plane including the optical axis of the excitation light, and
   of the light beams emitted from the laser element and incident on the optical element, light beams that pass through at least the respective second focal points of the plurality of lens regions overlap on the light emitting surface of the phosphor element.

5. The light source device according to claim 4,
   wherein the respective second focal points of the plurality of lens regions are present forward or rearward of the light emitting surface of the phosphor element.

6. The light source device according to claim 3,
   wherein each of the plurality of lens regions has a width in the direction of the second axis smaller than a width in the direction of the first axis, and
   the phosphor element is inclined, with the direction of the first axis as a rotational axis.

7. The light source device according to claim 6,
wherein part or all of the plurality of lens regions is a rectangle or a hexagon.

8. The light source device according to claim 6,
wherein a radiation angle of a light beam emitted from the laser element is different between the direction of the first axis and the direction of the second axis, and the light beam emitted from the laser element enters the plurality of lens regions so that one of the first axis and the second axis for a narrower radiation angle corresponds to the second axis.

9. The light source device according to claim 1,
wherein each of the plurality of lens regions is a Fresnel lens.

10. A projection device comprising:
the light source device according to claim 1.

* * * * *